United States Patent
Park et al.

(10) Patent No.: US 6,884,679 B2
(45) Date of Patent: Apr. 26, 2005

(54) FLASH MEMORY CELL AND METHOD OF MANUFACTURING THE SAME AND PROGRAMMING/ERASING/READING METHOD OF FLASH MEMORY CELL

(75) Inventors: Sung Kee Park, Sangjoo-Shi (KR); Young Seon You, Sungnam-Shi (KR); Yong Wook Kim, Ichon-Shi (KR); Yoo Nam Jeon, Ichon-Shi (KR)

(73) Assignee: Hynix Semiconductor Inc., Kyungki-do (KR)

( * ) Notice: Subject to any disclaimer, the term of this patent is extended or adjusted under 35 U.S.C. 154(b) by 0 days.

(21) Appl. No.: 10/616,720

(22) Filed: Jul. 10, 2003

(65) Prior Publication Data

US 2004/0013001 A1 Jan. 22, 2004

(30) Foreign Application Priority Data

Jul. 18, 2002 (KR) .............................. 10-2002-0042169

(51) Int. Cl.$^7$ ............................................. H01L 21/336
(52) U.S. Cl. ....................... 438/257; 438/259; 438/264
(58) Field of Search ................................ 438/257, 259, 438/264

(56) References Cited

U.S. PATENT DOCUMENTS 6,642,104 B2 * 11/2003 Chang ........................ 438/257

* cited by examiner

Primary Examiner—David Nelms
Assistant Examiner—Quoc Hoang
(74) Attorney, Agent, or Firm—Marshall, Gerstein & Borun LLP

(57) ABSTRACT

Disclosed is a flash memory cell and method of manufacturing the same, and programming/erasing/reading method thereof. The flash memory cell comprises a first tunnel oxide film formed at a given region of a semiconductor substrate, a first floating gate formed on the first tunnel oxide film, a second tunnel oxide film formed over the semiconductor substrate and along one sidewall of the first floating gate, a second floating gate isolated from the first floating gate while contacting the second tunnel oxide film, a dielectric film formed on the first floating gate and the second floating gate, a control gate formed on the dielectric film, a first junction region formed in the semiconductor substrate below one side of the second tunnel oxide film, and a second junction region formed in the semiconductor substrate below one side of the first tunnel oxide film. Therefore, the present invention can implement 2-bit cell or 3-bit cell of a high density using the existing process technology. Further, it can reduce the manufacture cost and implement a high-integrated flash memory cell that is advantageous than a conventional flash memory cell in view of charge storage/retention as well as programming time.

10 Claims, 6 Drawing Sheets

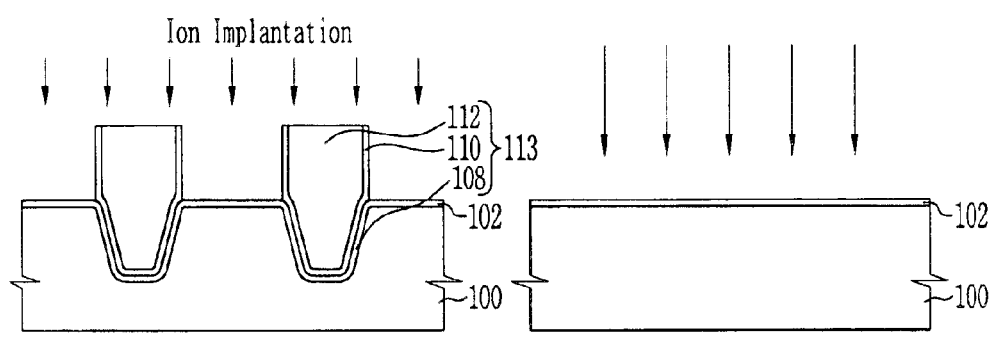
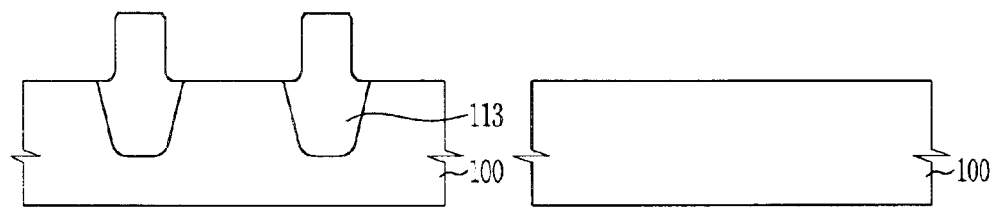
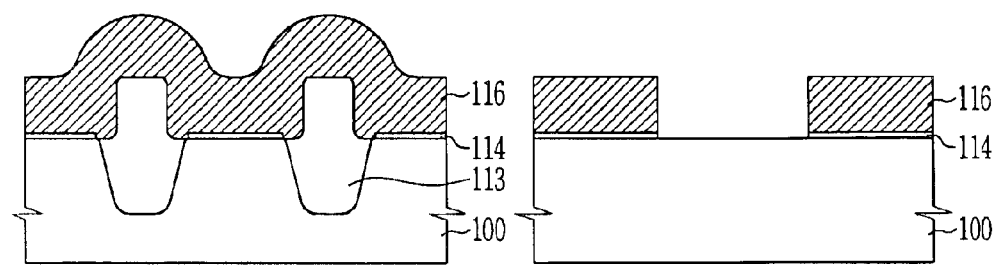

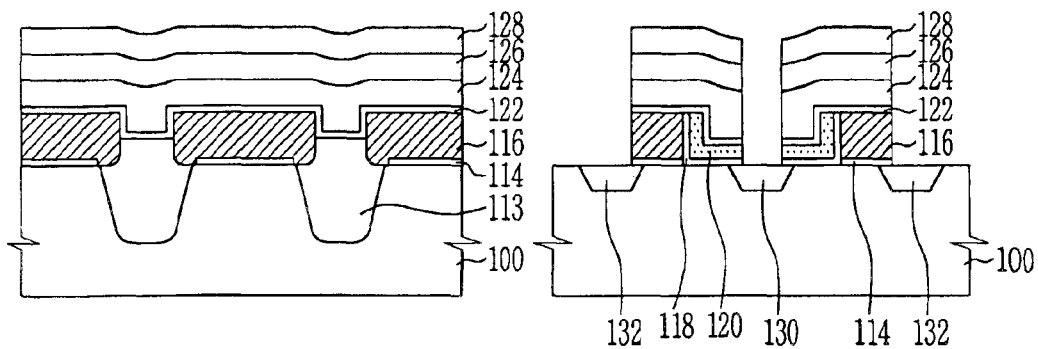
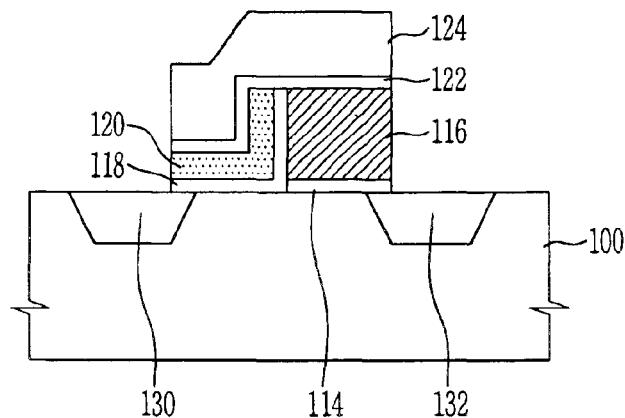
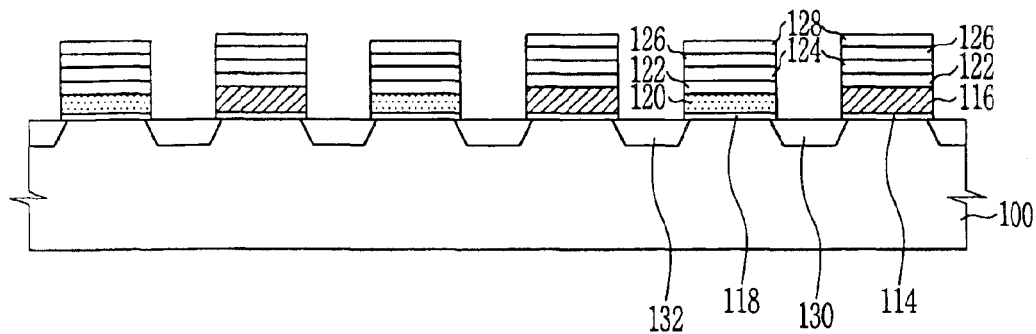

FLASH MEMORY CELL AND METHOD OF MANUFACTURING THE SAME AND PROGRAMMING/ERASING/READING METHOD OF FLASH MEMORY CELL

BACKGROUND OF THE INVENTION

1. Field of the Invention

The present invention relates to a semiconductor memory device and method of manufacturing the same, and more particularly, to a flash memory cell and method of manufacturing the same, and programming/erasing/reading method thereof.

2. Background of the Related Art

Information storage in NOR type flash memory cells is a mode in which difference in cell current due to difference between the threshold voltage (Vt) when charges (electrons) are stored at the floating gate and the threshold voltage (Vt) when charges (electrons) are not stored at the floating gate is compared and the status of the flash memory cell is then read.

Referring now to FIG. 1, a data storage method in a general flash memory cell will be described.

As shown in FIG. 1, current that is outputted when a constant voltage is always applied to the control gate and current that is always constantly outputted from the reference cell are compared in the sense amplifier. A case where lots of current flows and a case where a small amount of current flows are set to "0" and "1", respectively, which is called 1 bit.

However, a method of storing 1 bit at 1 (one) cell needs the same number of the cell to the degree of integration as the degree of integration in the flash memory cell is increased. In other words, a 64M flash needs cells of $2^{26}$ in number. Therefore, the multi-level cell (MLC) was developed in order to address this problem. Further, a method of fractionating the threshold voltages (Vt) of the flash memory cell regardless of the flash cell structure and then displaying their states has been developed. This method may be developed for the NAND type flash memory device as well as the NOR type flash memory device.

Most of the multi-level cells store information by fractionating the threshold voltage (Vt) into four states, as shown in FIG. 2. The states could be classified into "11", "10", "01" and "00", respectively. In other words, the multi-level cell has a structure in which 2-bit (four states) can be stored at 1 (one) cell. It would be the most ideal one if the threshold voltage (Vt) states are infinitely divided. So far, however, it is common to divide the threshold voltage (Vt) into four states.

However, in a common 2-bit multi-level cell, four states are divided into one stack cell. This method may have a problem when charge loss occurs due to charge retention. In other words, when an erased state is changed to a programmed state, charges of about 3000 in number are gathered in the floating gate. If there occurs charge loss when 3000 charges in number are divided by 4 states, it is recognized as another state. Thus there is a high probability that fail may happen.

SUMMARY OF THE INVENTION

Accordingly, the present invention is contrived to substantially obviate one or more problems due to limitations and disadvantages of the related art, and an object of the present invention is to provide a method of manufacturing a flash memory cell capable of storing data of high-density 2-bit or 3-bit using the existing process technology.

Another object of the present invention is to provide a flash memory cell that is advantageous than the conventional flash memory cell in view of programming time, and charge storage and retention, and can store data of 2-bit or 3-bit.

Still another object of the present invention is to provide programming/erasing/reading method of a flash memory cell capable of storing data of 2-bit or 3-bit.

In a preferred embodiment of the present invention, the method of is characterized in that it comprises the steps of In a preferred embodiment, the method of manufacturing the flash memory cell according to the present invention is characterized in that it comprises the steps of forming an isolation film having a projection that is projected higher than the surface of a semiconductor substrate in an isolation region of the semiconductor substrate, forming a first tunnel oxide film on the semiconductor substrate, depositing a material film for a first floating gate on the semiconductor substrate on which the first tunnel oxide film is formed, patterning the material film for the first floating gate, sequentially forming a second tunnel oxide film and a material film for a second floating gate over the semiconductor substrate on which the material film for the patterned first floating gate is formed along the step, isolating the material film for the first floating gate by means of the projection while removing the second tunnel oxide film on the material film for the first floating gate and the material film for the second floating gate by means of chemical mechanical polishing, forming a material film for a control gate and a hard mask layer on the resulting surface, and patterning the hard mask layer, the material film for the control gate, the material film for the second floating gate, the second tunnel oxide film, the material film for the first floating gate and the first tunnel oxide film, using a mask defining a gate pattern.

In another preferred embodiment, the flash memory cell of the present invention is characterized in that it comprises a first tunnel oxide film formed at a given region of a semiconductor substrate, a first floating gate formed on the first tunnel oxide film, a second tunnel oxide film formed over the semiconductor substrate and along one sidewall of the first floating gate, a second floating gate isolated from the first floating gate while contacting the second tunnel oxide film, a dielectric film formed on the first floating gate and the second floating gate, a control gate formed on the dielectric film, a first junction region formed in the semiconductor substrate below one side of the second tunnel oxide film, and a second junction region formed in the semiconductor substrate below one side of the first tunnel oxide film.

In a still another preferred embodiment, the programming method of the flash memory cell for storing data at the flash memory cell according to the present invention is characterized in that if electrons are to be injected into the first floating gate, a programming operation is performed by applying a programming voltage to the control gate, connecting the first junction region and the ground terminal and applying a voltage lower than the programming voltage but higher than the ground voltage to the second junction region, and if the electrons are to be injected into the second floating gate, the programming operation is performed by applying a programming voltage to the control gate, applying a voltage lower than the programming voltage but higher than the ground voltage to the first junction region and connecting the second junction region and the ground terminal, wherein the programming operations are independently performed for the first floating gate and the second floating gate.

In a still another preferred embodiment, the erasing method of the flash memory cell for erasing data stored at the flash memory cell according to the present invention is characterized in that if electrons injected into the first floating gate are to be discharged, an erasing operation is performed by applying an erasing voltage to the control gate, and applying a voltage higher than the ground voltage to the second junction region with the first junction region floated, and if electrons injected into the second floating gate are to be discharged, the erasing operation is performed by applying the erasing voltage to the control gate, and applying a voltage higher than the ground voltage to the first junction region with the second junction region floated, wherein the erasing operations are independently performed for the first floating gate and the second floating gate.

In a still another preferred embodiment, the reading method of a flash memory cell for reading data stored at the flash memory cell according to the present invention is characterized in that a reading operation is performed by applying a reading voltage to the control gate, connecting the first junction region to the ground terminal, applying a voltage lower than the reading voltage but higher than the ground voltage to the second junction region and then sensing cell current flowing into the second junction region, or by applying the reading voltage to the control gate, connecting the second junction region to the ground terminal, applying a voltage lower than the reading voltage but higher the ground voltage to the first junction region, and then sensing cell current flowing into the first junction region.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

In another aspect of the present invention, it is to be understood that both the foregoing general description and the following detailed description of the present invention are exemplary and explanatory and are intended to provide further explanation of the invention as claimed.

BRIEF DESCRIPTION OF THE DRAWINGS

The above and other objects, features and advantages of the present invention will be apparent from the following detailed description of the preferred embodiments of the invention in conjunction with the accompanying drawings, in which:

FIG. 4~FIG. 13 are cross-sectional views of the flash memory cells for explaining a method of manufacturing the flash memory cell according to a preferred embodiment;

FIG. 14 is a cross-sectional view of the flash memory cell capable of storing data of 2-bit or 3-bit data according to the present invention; and FIG. 15 is a cross-sectional view of a flash memory cell in which a flash memory cell consisting of a silicon nitride film floating gate and a flash memory cell consisting of a polysilicon floating gate.

DETAILED DESCRIPTION OF THE PREFERRED EMBODIMENT

Figure 1:
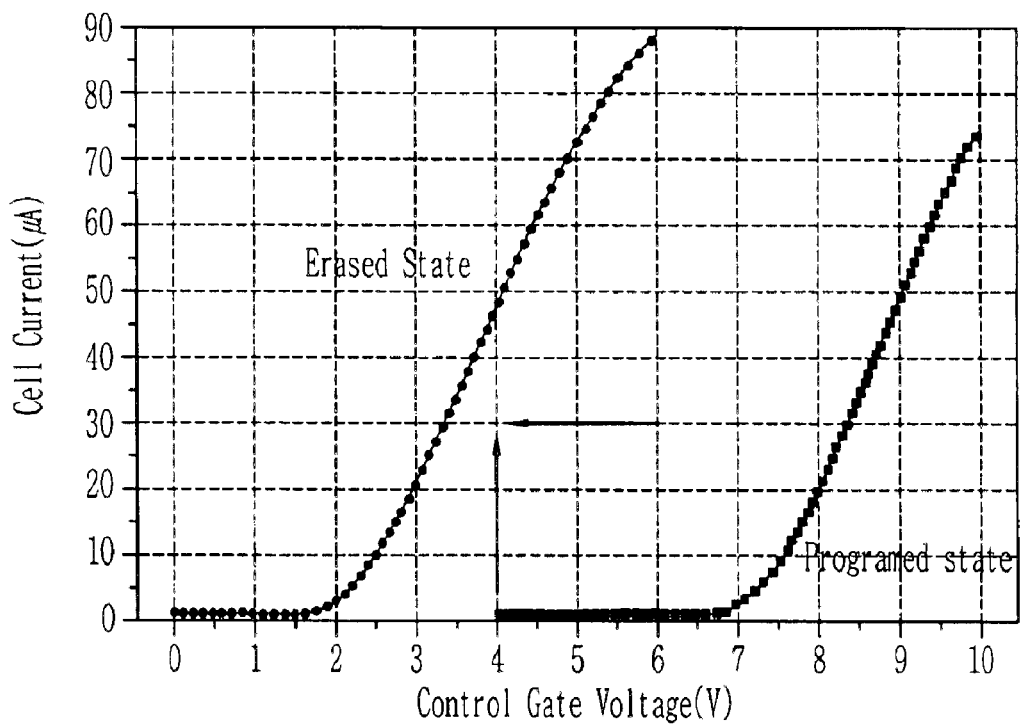
FIG. 1 is a graph illustrating a data storage method in a general flash memory cell.
Figure 2:
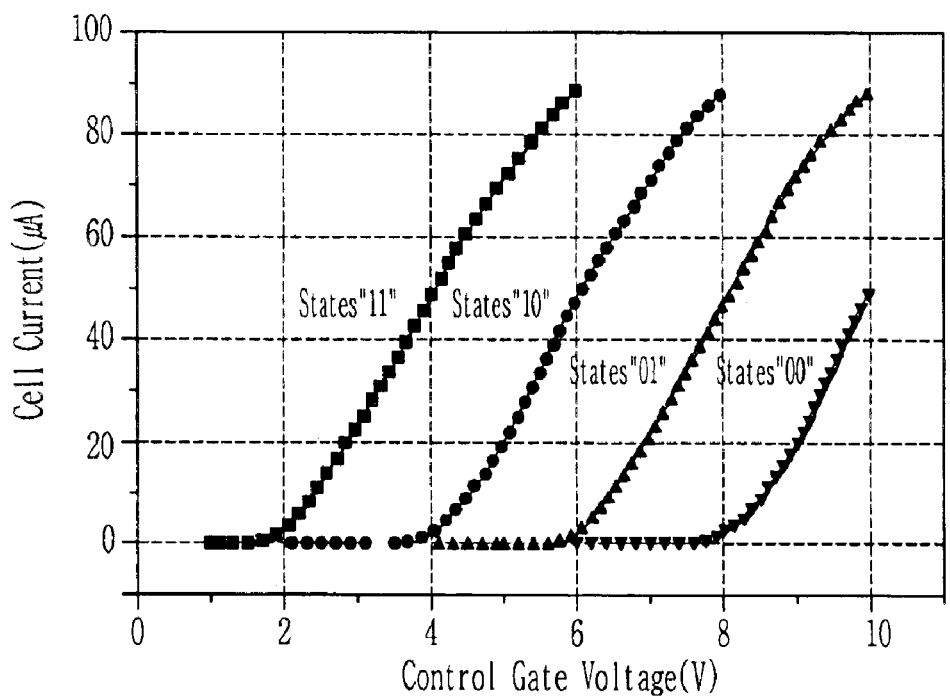
FIG. 2 is a graph illustrating a data storage method of a multi-level cell consisting of one floating gate.

Reference will now be made in detail to the preferred embodiments of the present invention, examples of which are illustrated in the accompanying drawings, in which like reference numerals are used to identify the same or similar parts and the thickness and size of each of layers are exaggerated for convenience' sake and clarity. In below explanation, when it is described that one layer is located on the other layer, it may means that the other layer may be located right on one layer and a third layer may be intervened between them.

Figure 3:
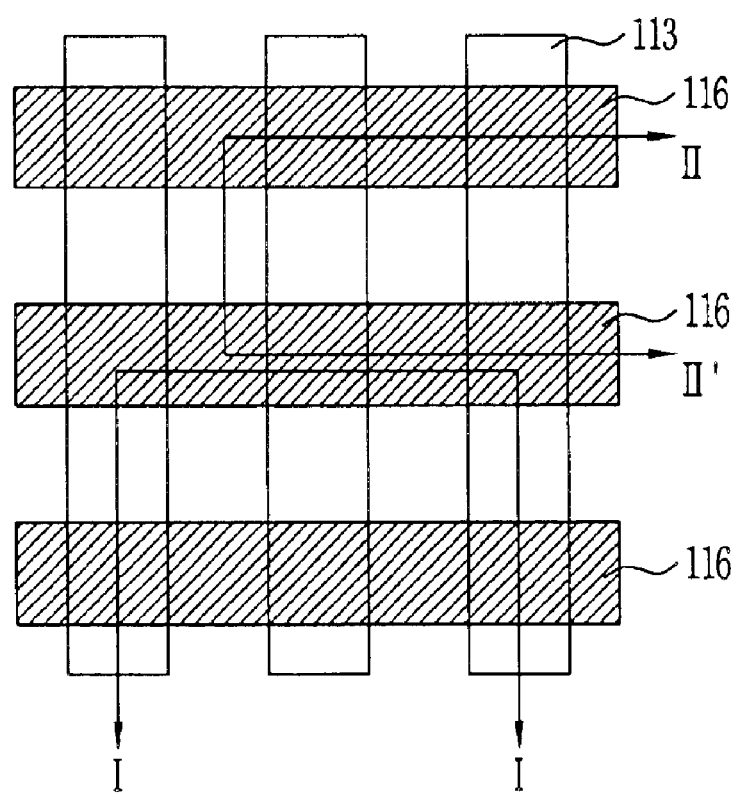
FIG. 3 is a layout diagram of a flash memory cell according to a preferred embodiment of the present invention.

FIG. 3 is a layout diagram of a flash memory cell according to a preferred embodiment of the present invention. In FIG. 3, a reference numeral '113' indicates an isolation film and '116' indicates a first polysilicon film pattern used as a floating gate.

FIG. 4~FIG. 13 are cross-sectional views of the flash memory cells for explaining a method of manufacturing the flash memory cell according to a preferred embodiment. FIG. 4(a)~FIG. 13(a) are cross-sectional views of the flash memory cells taken along lines I—I in FIG. 3, and FIG. 4(b)~FIG. 13(b) are cross-sectional views of the flash memory cells taken along lines II–II' in FIG. 3, all of which are shown corresponding to FIG. 3a~FIG. 13(a), respectively.

Figure 4A:
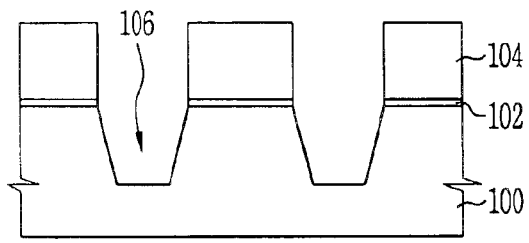
Figure 4B:
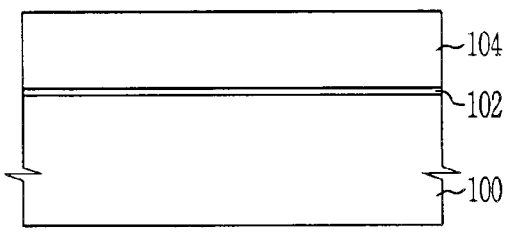

Referring now to FIG. 4(a) and FIG. 4(b), a pad oxide film 102 is formed on a semiconductor substrate 100. At this time, the pad oxide film 102 is formed by a dry or wet oxidization mode and is formed in thickness of about 70~100 Å at a temperature range of 750~900° C.

A pad nitride film 104 is the deposited on the pad oxide film 102. At this time, the pad nitride film 104 is formed by means of LP-CVD (low pressure-chemical vapor deposition) method and is formed in thickness enough for the isolation film in a subsequent process to sufficiently project, for example about 2000~3500 Å.

Next, a trench 106 is formed within the semiconductor substrate 100 through patterning for forming the isolation film, thus defining an isolation region and an active region. In other words, a photoresist pattern (not shown) to define the isolation region is formed. Also, the pad nitride film 104, the pad oxide film 102 and the semiconductor substrate 100 are etched using the photoresist pattern as an etch mask, thereby forming the trench 106 within the semiconductor substrate 100. At this time, the trench 106 is formed in depth of 2500~3500 Å, preferably about 3000 Å.

Figure 5A:
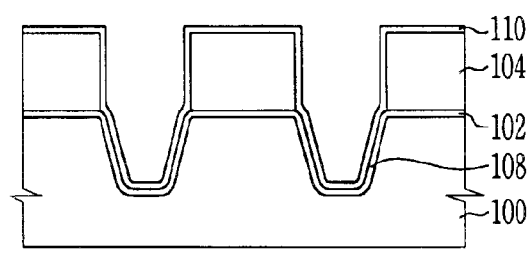
Figure 5B:
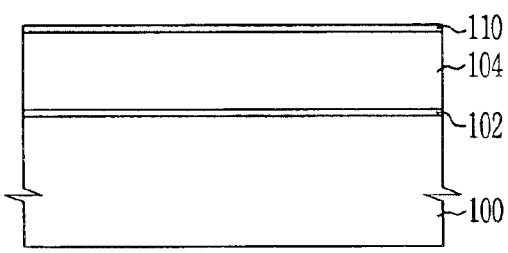

By reference to FIG. 5(a) and FIG. 5(b), in order to compensate for etch damage at the sidewall and bottom of the trench 106 and make rounded the top and bottom corner of the trench 106, a sacrificial oxide film (not shown) is formed within the trench 106. At this time, the sacrificial oxide film is formed in a dry oxidization mode. It is also preferred that the sacrificial oxide film is formed in thickness of 150~250 Å at a temperature range of about 1000~1150° C.

After the sacrificial oxide film is removed using an etchant, sidewall oxidization is performed to form a sidewall oxide film 108 thicker than the sacrificial oxide film within the trench 106. At this time, the sacrificial oxide film may be removed using DHF (diluted HF) solution (for example, HF solution in which water and HF are mixed at the ratio of about 50:1), or BOE (buffered oxide etchant) solution (for example, solution in which HF and NH$_4$F are mixed at the ratio of about 100:1 or 300:1). At this time, it is preferred that the sidewall oxide film 108 is formed in thickness of about 300~450 Å using a wet oxidization mode at a temperature of about 750~850° C.

A liner 110 is then formed on the entire structure. The liner 110 serves to enhance adhesion with a trench insulating film (see '112' in FIG. 6(a)) to be formed in a subsequent process. It is preferred that the liner 110 is formed using a high-temperature oxide (HTO) film. For example, the liner 110 is formed by reacting SiH$_2$Cl$_2$ (dichlorosilane; DCS) and oxygen and depositing it at high temperature (for example, about 1000~1100° C.). It is preferred that the liner 110 is formed in thickness of about 100~120 Å.

Figure 6A:
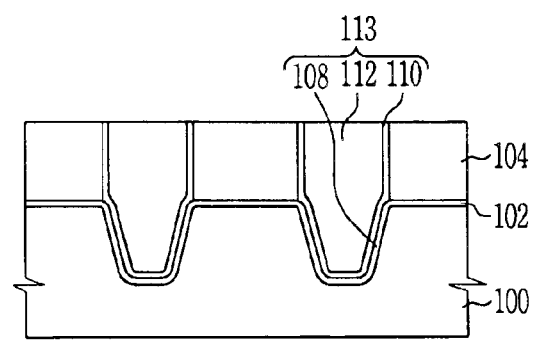
Figure 6B:
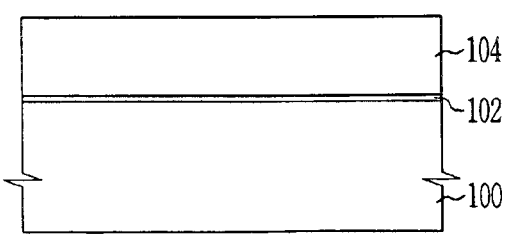

Referring now to FIG. 6(a) and FIG. 6(b), the trench 106 is buried by depositing a trench insulating film 112. At this time, the trench insulating film 112 is deposited in thickness sufficiently deposited on the top surface of the pad nitride film 104 while sufficiently burying the trench 106, for example about 5000~10000 Å. It is preferred that the trench insulating film 112 is formed using a HDP (high density plasma) oxide film. Also, the trench insulating film 112 is buried so that void, etc. is not formed within the trench 106.

The trench insulating film 112 and the liner 110 are planarized by chemical mechanical polishing. At this time, it is preferred that the chemical mechanical polishing process is performed until the pad nitride film 104 is exposed. An isolation film 113 having a projection having a thickness almost same to that of the pad nitride film 104 is thus formed by the chemical mechanical polishing process.

Referring to FIG. 7(a) and FIG. 7(b), the pad nitride film 104 is removed. The pad nitride film 104 may be removed using strip process. The pad nitride film 104 may be removed using, for example phosphoric acid (H$_3$PO$_4$) solution.

Thereafter, ion implantation is implemented for the purpose of well junction and to control the threshold voltage. Next, ion implantation is performed in order to form a source region and a drain region.

In the following drawings, the sidewall oxide film 108, the liner 110 and the trench insulating film 112 are illustrated only as the isolation film 113. Also in the following description, the sidewall oxide film 108, the liner 110 and the trench insulating film 112 will be collectively described as the isolation film 113.

Referring to FIG. 8(a) and FIG. 8(b), the pad oxide film 102 is removed. At this time, the pad oxide film 102 may be removed using DHF (diluted HF) solution (for example, HF solution in which water and HF are mixed at the ratio of about 50:1), or BOE (buffered oxide etchant) solution (for example, solution in which HF and NH$_4$F are mixed at the ratio of about 100:1 or 300:1).

By reference to FIG. 9(a) and FIG. 9(b), a first tunnel oxide film 114 is formed over the semiconductor substrate 100. It is preferred that the first tunnel oxide film 114 is formed using a wet oxidization mode. For example, the first tunnel oxide film 114 is formed by performing wet oxidization at a temperature of about 750~800° C. and implementing annealing under nitrogen (N$_2$) atmosphere at a temperature of about 900~910 Å for 20~30 minutes.

Next, a first polysilicon film 116 used as a first floating gate is deposited. The first polysilicon film 116 is deposited in thickness of about 500~200 Å. It is preferred that the first polysilicon film 116 is formed by means of the LP-CVD method using SiH$_4$ or Si$_2$H$_6$ and PH$_3$ gas. At this time, it is preferred that deposition is made so that the grain size of the first polysilicon film 116 is minimized. The first polysilicon film 116 is formed at a temperature of about 580~620° C. under a low pressure of about 0.1~3 Torr. Next, the first polysilicon film 116 and the first tunnel oxide film 114 are patterned, as shown in FIG. 9(b).

Figure 10A:
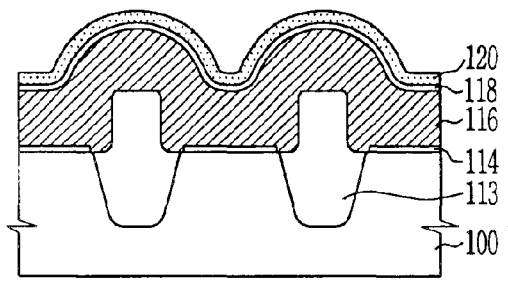
Figure 10B:
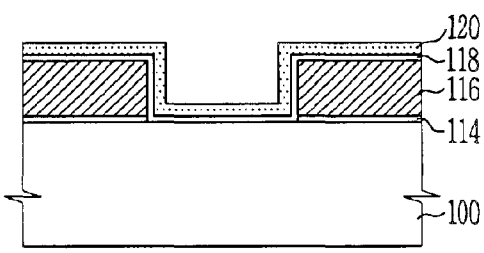

By reference to FIG. 10(a) and FIG. 10(b), a second tunnel oxide film 118 is formed over the semiconductor substrate 100. It is preferred that the second tunnel oxide film 118 is formed in thickness of about 50~100 Å using high-temperature oxide (HTO).

Thereafter, a silicon nitride (Si$_3$N$_4$) film 120 to be used as a second floating gate is formed over the semiconductor substrate 100 having the second tunnel oxide film 118 formed thereon. At this time, it is preferred that the silicon nitride film 120 is formed in thickness smaller than the deposition thickness of the first polysilicon film 116, for example about 100~1000 Å.

Figure 11A:
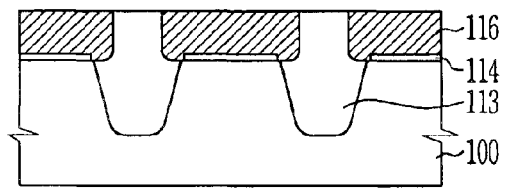
Figure 11B:
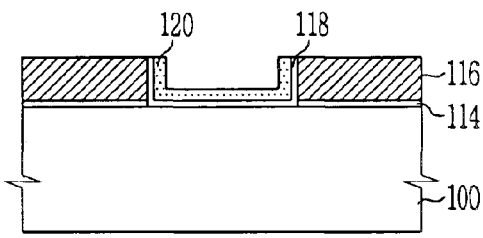

Referring to FIG. 11(a) and FIG. 11(b), the second tunnel oxide film 118 and the silicon nitride film 120 on the first polysilicon film 116 are removed by means of the chemical mechanical polishing process. At this time, the chemical mechanical polishing process is performed until the projection of the isolation film 113 is completely exposed, so that the first polysilicon film 116 is completely isolated by the isolation film 113.

Figure 12A:
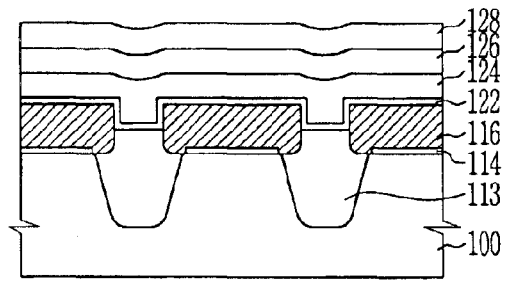
Figure 12B:
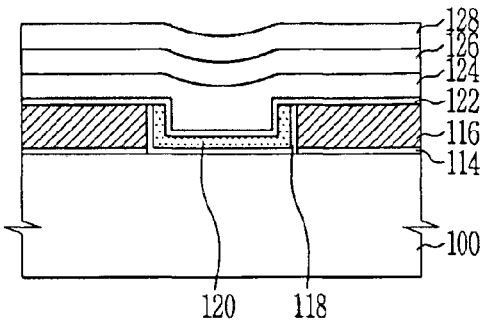

Referring to FIG. 12(a) and FIG. 12(b), the isolation film 113 projected between the first polysilicon films 116 is etched by a desired target. Thereby, the exposed area of the first polysilicon film 116 is increased while the sidewall of the first polysilicon film 116 that was in contact with the projection of the isolation film 113, thus increasing the coupling ratio.

Next, a dielectric film 122 is formed over the semiconductor substrate 100. It is preferred that the dielectric film 122 has a structure of an oxide film/nitride film/oxide film shape, i.e., ONO (SiO$_2$/Si$_3$N$_4$/SiO$_2$) structure. It is also preferred that the oxide film of the dielectric film 122 is formed by use of a high-temperature oxide (HTO) film using SiH$_2$Cl$_2$ (dichlorosilane; DCS) and H$_2$O as a source gas. Further, it is preferred that the nitride of the dielectric film 122 is formed by means of the LP-CVD method using NH$_3$ and SiH$_2$Cl$_2$ (dichlorosilane; DCS) as a reaction gas at a low pressure of about 0.1~3 Torr and temperature of about 650~800° C.

Thereafter, a second polysilicon film 124 used as a control gate and a silicide film 126 are sequentially deposited on the dielectric film 122. It is preferred that the silicide film 126 is formed using a tungsten silicon (WSi) film. It is also preferred that the second polysilicon film 124 is formed using a thin amorphous silicon film that is deposited at a temperature of about 510~550° C. and a low pressure of below 0.1~3 torr. It is further preferred that the tungsten silicon (WSi) film being the silicide film 126 is formed at a temperature between 300~500° C. using reaction of SiH$_4$ (monosilane; MS) or SiH$_2$Cl$_2$ (dichlorosilane; DCS) and WF$_6$. It is preferred that the tungsten silicon (WSi) film is grown at the stoichiometry ratio of about 2.0~2.8 in order to implement an adequate step coverage and minimizes the sheet resistance (Rs). Next, a hard mask layer 128 is formed on the silicide film 126. At this time, the hard mask layer 128 is formed using a silicon nitride film.

Referring to FIG. 13(a) and FIG. 13(b), a gate patterning process is implemented. In other words, the hard mask layer 128, the silicide film 126, the second polysilicon film 124 and the dielectric film 122 are patterned using a mask for forming a control gate. The first polysilicon film 116, the first tunnel oxide film 114 and the second tunnel oxide film 118 are then patterned by means of self-aligned etch process using the patterned hard mask layer 128. Thereafter, an impurity ion is implanted into the semiconductor substrate 100, thus simultaneously forming a first junction region 130 in the semiconductor substrate 100 below one side of the second tunnel oxide film 118 and a second junction region 132 in the semiconductor substrate 100 below one side of the first tunnel oxide film 114.

Subsequent processes are same to the common manufacture processes of the flash memory cell. Therefore, explanation thereof will be omitted.

In the following explanation, the operation of the flash memory cell manufactured by the preferred embodiment of the present invention will be described.

FIG. 14 is a cross-sectional view of the flash memory cell capable of storing data of 2-bit or 3-bit data according to the present invention. In FIG. 14, the silicide film and the hard mask layer formed on the control gate 124 are not illustrated for convenience' sake in order to express the operation of the cell.

Referring now to FIG. 14, the flash memory cell of the present invention comprises the first tunnel oxide film 114 formed on a given region of the semiconductor substrate 100, the first floating gate 116 formed on the first tunnel oxide film 114, the second tunnel oxide film 118 formed on the semiconductor substrate 100 and along one sidewall of the first floating gate 116, the second floating gate 120 formed in contact with the second tunnel oxide film 118 and isolated from the first floating gate 116, the dielectric film 122 formed on the first floating gate 116 and the second floating gate 120, the control gate 124 formed on the dielectric film 122, the first junction region 130 formed in the semiconductor substrate 100 below the one side of the second tunnel oxide film 118, and the second junction region 132 formed in the semiconductor substrate 100 below the one side of the first tunnel oxide film 114. The structure of the flash memory cell according to the present invention is a 2-bit cell structure (4 level states). This structure has an advantage that charges are stored at respective floating gates since the first floating gate 116 and the second floating gate 120 are separated by the second tunnel oxide film (high-temperature oxide film) 118. This is advantageous in view of charge storage/retention as well as programming time when compared with a case where a conventional structure has 1 (one) floating gate.

Meanwhile, in the first floating gate 116, i.e., the floating gate made of polysilicon, charges are uniformly distributed over the entire floating gate in order to make equipotential when the charges are inputted to the floating gate. In the second floating gate 120, i.e., the floating gate made of the silicon nitride film, the charges locally exist around the first junction region 130 since they exist as a charge trap shape in view of the properties of the silicon nitride film.

In case of the second floating gate 120, a high-temperature oxide film is used as the tunnel oxide film 118. This has an advantage that the cell threshold voltage (Cell Vt) could be suitably controlled by adjusting the thickness.

A programming operation of the flash memory cell for storing data stored at the flash memory cell of the present invention comprises applying a programming voltage to the control gate 124, connecting the first junction region 130 and the ground terminal and applying a voltage lower than the programming voltage but higher than the ground voltage to the second junction region 132, if the electrons are to be injected to the first floating gate 116. Meanwhile, if the electrons are to be injected to the second floating gate 120, the programming operation of the flash memory cell for storing data stored at the flash memory cell of the present invention comprises applying the programming voltage to the control gate 124, applying a voltage lower than the programming voltage but higher than the ground voltage to the first junction region 130, and connecting the second junction region 132 and the ground terminal. The first floating gate 116 and the second floating gate 120 independently perform the programming operations. At this time, the programming voltage is 7V~9V, and the voltage lower than the programming voltage but higher than the ground voltage may be 4V~5V.

An erasing operation of the flash memory cell for erasing data at the flash memory cell of the present invention comprises applying an erasing voltage to the control gate 124, and applying a voltage higher than the ground voltage to the second junction region 132 with the first junction region 130 floated, if electrons injected into the first floating gate 116 are to be discharged. If the electrons injected into the second floating gate 120 are to be discharged, the erasing operation of the flash memory cell for erasing data at the flash memory cell of the present invention comprises applying an erasing voltage to the control gate 124, and applying a voltage higher than the ground voltage to the first junction region 130 with the second junction region 132 floated. The first floating gate 116 and the second floating gate 120 independently perform the erasing operations. At this time, the erasing voltage is −8V~−9V and the voltage higher than the ground voltage may be 4V~5V.

Further, the erasing operation of the flash memory cell for erasing data stored at the flash memory cell of the present invention comprises applying an erasing voltage to the control gate 124 with the first junction region 130 and the second junction region 132 floated, and applying a voltage higher than the ground voltage to the semiconductor substrate 100, so that electrons injected into the first floating gate 116 and the second floating gate 120 are simultaneously discharged. At this time, the erasing voltage is −8V~−9V and the voltage higher than the ground voltage may be 8V~9V.

A reading operation of the flash memory cell for reading data stored at the flash memory cell of the present invention comprises applying a reading voltage to the control gate 124, connecting the first junction region 130 to the ground terminal, applying a voltage lower than the reading voltage but higher than the ground voltage to the second junction region 132 and then sensing cell current flowing into the second junction region 132, or applying the reading voltage to the control gate 124, connecting the second junction region 132 to the ground terminal, applying a voltage lower than the reading voltage but higher than the ground voltage to the first junction region 130 and then sensing cell current flowing into the first junction region 130. At this time, the reading voltage is 4V~5V, and the voltage lower than the reading voltage but higher than the ground voltage may be 0.8V~1V.

Even if the flash memory cell of the present invention is programmed to have four states in the first floating gate 116, i.e., the floating gate made of polysilicon, a 3-bit (8 level states) may be implemented.

Meanwhile, the flash memory cell made of the silicon nitride film floating gate 120 and the flash memory cell made of the polysilicon floating gate 116 may be used with them serially connected. (see FIG. 15). This may be implemented by patterning the flash memory cell made of the silicon nitride film floating gate 120 and the flash memory cell made of the polysilicon floating gate 116 using the mask for patterned gate patterning so that they are arranged in a serial shape, during the gate patterning process described by reference to FIG. 13(*a*) and FIG. 13(*b*).

As described above, the present invention has advantageous effects that it can implement 2-bit cell or 3-bit cell of a high density using the existing process technology, and thus reduce the manufacture cost and implement a high-integrated flash memory cell that is advantageous than a conventional flash memory cell in view of charge storage/retention as well as programming time.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method of manufacturing a flash memory cell, comprising the steps of:

forming an isolation film having a projection that is projected higher than the surface of a semiconductor substrate in an isolation region of the semiconductor substrate;

forming a first tunnel oxide film on the semiconductor substrate;

depositing a material film for a first floating gate on the semiconductor substrate on which the first tunnel oxide film is formed;

patterning the material film for the first floating gate and the first tunnel oxide film;

sequentially forming a second tunnel oxide film and a material film for a second floating gate over the semiconductor substrate on which the material film for the patterned first floating gate is formed along the step;

isolating the material film for the first floating gate by means of the projection while removing the second tunnel oxide film on the material film for the first floating gate and the material film for the second floating gate by means of chemical mechanical polishing;

forming a material film for a control gate and a hard mask layer on the resulting surface; and patterning the hard mask layer, the material film for the control gate, the material film for the second floating gate, the second tunnel oxide film, the material film for the first floating gate and the first tunnel oxide film, using a mask defining a gate pattern.

2. The method as claimed in claim 1, further comprising the step of etching the projection of the isolation film formed between the material film for the first floating gates, before the step of forming the material film for the control gate and the hard mask layer.

3. The method as claimed in claim 1, wherein the step of forming the isolation film having the projection comprising the sub steps of:

forming a pad oxide film and a pad nitride film on the semiconductor substrate;

etching the pad nitride film, the pad oxide film and the semiconductor substrate using the mask defining the isolation region, thus forming a trench;

forming an oxide film along the sidewall of the trench;

forming a trench type isolation film that buries the trench up to the top surface of the patterned pad nitride film;

removing the pad nitride film; and removing the pad oxide film.

4. The method as claimed in claim 1, wherein the first tunnel oxide film is formed by means of a wet oxidization mode.

5. The method as claimed in claim 1, wherein the second tunnel oxide film is formed using a high-temperature oxide film.

6. The method as claimed in claim 1, wherein the second tunnel oxide film is formed in thickness of 50~100 Å.

7. The method as claimed in claim 1, wherein the material film for the first floating gate is a polysilicon film.

8. The method as claimed in claim 1, wherein the material film for the second floating gate is a silicon nitride film.

9. The method as claimed in claim 1, wherein the material film for the second floating gate is formed in thickness of 100~1000 Å.

10. The method as claimed in claim 1, wherein the dielectric film is formed by sequentially stacking a silicon oxide film, a silicon nitride film and a silicon oxide film.

* * * * *

UNITED STATES PATENT AND TRADEMARK OFFICE
CERTIFICATE OF CORRECTION

PATENT NO. : 6,884,679 B2
DATED : April 26, 2005
INVENTOR(S) : Sung K. Park et al.

It is certified that error appears in the above-identified patent and that said Letters Patent is hereby corrected as shown below:

Title page,
Item [75], Inventors, after "Sung Kee Park" please delete "Sangjoo-Shi" and insert
-- Kyungsangbuk-Do -- in its place.
after "Young Seon You" please delete "Sungman-Shi" and insert
-- Kyungki-Do -- in its place.
after "Yong Wook Kim" please delete "Ichon-Shi" and insert
-- Kyungki-Do -- in its place.
after "Yoo Nam Jeon" please delete "Ichon-Shi" and insert
-- Kyungki-Do -- in its place.

Signed and Sealed this

Twenty-third Day of August, 2005

JON W. DUDAS
*Director of the United States Patent and Trademark Office*